United States Patent [19]
Toda

[11] Patent Number: 5,644,537
[45] Date of Patent: Jul. 1, 1997

[54] MEMORY DEVICE AND SERIAL-PARALLEL DATA TRANSFORM CIRCUIT

[75] Inventor: Haruki Toda, Yokohama, Japan

[73] Assignee: Kabushiki Kaisha Toshiba, Tokyo, Japan

[21] Appl. No.: 681,169

[22] Filed: Jul. 22, 1996

Related U.S. Application Data

[62] Division of Ser. No. 346,080, Nov. 29, 1994, Pat. No. 5,568,428.

[30] Foreign Application Priority Data

Nov. 29, 1993 [JP] Japan .................. 5-298074

[51] Int. Cl.$^6$ .................................................. G11C 7/00
[52] U.S. Cl. ...................... 365/189.05; 365/219; 365/221
[58] Field of Search ........................... 365/189.05, 221, 365/219, 230.05, 230.03, 238.5

[56] References Cited

U.S. PATENT DOCUMENTS

| | | | |
|---|---|---|---|
| 4,683,555 | 7/1987 | Pinkham | 365/230.03 |
| 4,817,058 | 3/1989 | Pinkham | 365/195 |
| 5,029,134 | 7/1991 | Watanabe | 365/185.05 |
| 5,111,386 | 5/1992 | Fujishima et al. | 365/230.03 |

FOREIGN PATENT DOCUMENTS

| | | |
|---|---|---|
| 385389 | 9/1990 | European Pat. Off. |
| 432509 | 6/1991 | European Pat. Off. |

Primary Examiner—David C. Nelms
Assistant Examiner—Vu A. Le
Attorney, Agent, or Firm—Loeb & Loeb LLP

[57] ABSTRACT

In DRAM, a part of data in a row are rewritten at high speed. The memory device comprises dynamic type cell blocks 11; sense amplifiers 3 for sensing data of the cell blocks 11; latches 2 for storing data; data transfer gates for transferring data between the sense amplifiers 3 and the latches 2; and byte write mask circuit blocks 1 for controlling only the data transfer gates corresponding to only the latches 2 in which data have been written, to transfer data to the sense amplifiers 3. The byte write mask circuit block 1 opens only the transfer gates corresponding to the latches 2 to which data are written and further transfer data from the latches 2 to the sense amplifiers 3. Therefore, when data are required to be written in the cell blocks, since only the necessary data are written in the latches 2, it is possible to eliminate wasteful data write to the latches 2, thus enabling a high speed data transfer to the cell blocks 11.

3 Claims, 7 Drawing Sheets

MEMORY DEVICE AND SERIAL-PARALLEL DATA TRANSFORM CIRCUIT

This is a divisional of application Ser. No. 08/346,080, filed Nov. 29, 1994, now U.S. Pat. No. 5,568,428.

FIELD OF THE INVENTION

The present invention relates to a memory device and a serial-parallel data transforming circuit, and more specifically to the memory device and the serial-parallel data transforming circuit which can write data in cells at high speed in a DRAM, in particular.

BACKGROUND OF THE INVENTION

As is well known, when cell data are accessed in the DRAM, since small charge information stored in the cells must be sensed and further amplified, it takes a long time for accessing the cell data. In this case, the sensing operation must be executed for all the cells belonging to selected word lines, that is, selected rows in a cell array.

By the utilization of the sensing operation, a page mode is well known in which the cells belonging to the same row are accessed at high speed. In this page mode, bit lines and sense amplifiers connected to a number of cells are rewritten compulsorily. Therefore, there inevitably exists a speed limit in the write cycle in this page mode.

To overcome this problem, there has been known a method of executing the page mode without directly transfer data to and from the bit lines (as disclosed in Japanese Published Unexamined (Kokai) Patent Application No. 60-7690, or U.S. Pat. No. 4,608,666). In this method, a row of SRAM cells is arranged along the rows of the DRAM cell array, and data are transferred between the DRAM and an external circuit through the SRAM cells. In this method, since the sense operation and the bit line capacitance of the DRAM cells can be separated from the external data transfer due to the presence of the SRAM cells, it is possible to obtain a high speed access determined by the access cycle to the SRAM.

In the above-mentioned method of accessing the DRAM via the SRAM, however, data transfer is executed between the SRAM and the DRAM in unit of row, some restriction conditions arises in the SRAM cells. In more detail, since the contents of the SRAM cells in which data are not written are undefined, when data are written in a part of the SRAM cells and further the written data are transferred to the DRAM cells, undefined data are written in the DRAM cells corresponding to the SRAM cells to which data are not written, with the result that the data so far stored in the DRAM cells are destroyed. To solve this problem, it is necessary to write data in all the SRAM cells or to transfer the contents of the DRAM cells (to which data are to be transferred) to the SRAM cells previously, before a part of the DRAM cell contents are rewritten.

The problem involved in the prior art memory device will be described in further detail hereinbelow.

In the memory device for accessing a DRAM via a SRAM, to rewrite one row of the DRAM, data of the SRAM are transferred in parallel, and data in one row of the DRAM are rewritten. In this case, where all bit data of the SRAM have been written immediately before data transfer, one row data of the DRAM are replaced with the SRAM data due to parallel transfer. However, in order to rewrite a part of the data in a row of the DRAM, when data are written in a part of bits of the SRAM and data are not written in other remaining bits of the SRAM, the bit data not written in the SRAM are not decided (either of H or L). Under these conditions, when the data are transferred from the SRAM to the DRAM as described above, data of "1" or "0" can be written correctly from the data-written bits to the corresponding bits of the DRAM for data rewrite. However, the undecided data are written from the data-undecided bits to the corresponding bits of the DRAM. Therefore, a part of data not required to be rewritten in the DRAM are written as undecided data, thus data being destroyed.

To prevent the above-mentioned problem, there are two methods as described above. One method is as follows: even when a part of bits in a row of the DRAM are required to be rewritten, all the bits of the SRAM are previously written, and all the bits of the SRAM are transferred to one row of the DRAM. The other method is as follows: as with the case of the ordinary DRAM provided with the SRAM, all the data in a row of the DRAM are transferred to the SRAM, and only a part of the bits already transferred to the SRAM are written, without writing remaining bits (left as they are). In this case, when data are transferred from the SRAM to the row of the DRAM, the rewritten data in the SRAM are transferred to the corresponding bits of the DRAM for data rewrite. The other bits of the DRAM are restored to the original data of their own. In the above-mentioned two prior art methods, however, in spits of the fact that only a part of bits in a row of the DRAM are rewritten, there exists such a problem in that it takes a long time.

As described above, in the conventional memory device, an additional time is required to transfer data from the DRAM cells to the SRAM cells. In addition, since another time required to write data in all the SRAM cells cannot be disregarded and therefore not negligible, some problems arise in that the effect of the high cycle operation is reduced and further a large limitation exists in use of the above-mentioned method.

SUMMARY OF THE INVENTION

With these problems in mind, therefore, it is the object of the present invention to provide a memory device of high speed access, by which data can be transferred from the SRAM to the DRAM after data have been written in a part of the columns in a row of the SRAM, when data are rewritten in a part of the row or when data are written at only a part of the column addresses, without any special considerations for use, in such a memory device that the sensing operation related to the DRAM row access and the column access operation can be executed separately.

To achieve the above-mentioned object, the present invention provides a memory device comprising: at least one memory block having a plurality of memory cells arranged into roughly a matrix pattern, a column group being formed by a predetermined number of columns; a plurality of sense amplifiers each provided for each of the columns; a plurality of latches each provided for each of said sense amplifiers, data being transferred between each of said latches and corresponding each of said sense amplifiers, a latch group being formed by a predetermined number of said latches, the latch group corresponding one-to-one to the column group; a column decoder for outputting a column group select signal to select a predetermined number of the latch groups, external data being written only in the selected latch groups; and a plurality of write mask circuits each for storing the latch groups in which data have been written and for enabling data written in the selected latch groups to be transferred to said corresponding sense amplifiers.

Further, the present invention provides a serial-parallel data transforming circuit, comprising: serial data inputting means for receiving external serial data;latching means having a plurality of latches for latching each of the serial data, a predetermined number of said latches constituting a plurality of latch groups, respectively for outputting data latched by a plurality of said latches as parallel data therefrom; a plurality of data transfer gates each provided at an output terminal of each of said latches; and transfer masking means for selecting any of said latch groups, writing the serial data in the latches of the selected-latch group, and turning on said data transfer gates corresponding to the latch group in which data have been written to output the parallel data therefrom while keeping closed said data transfer gates corresponding to the latch group in which data have been not written.

In the memory device according to the present invention, the control means opens only the data transfer means corresponding to the latch circuits to which data have been written, so that data can be transferred from the latch circuits to the sense amplifiers. Therefore, only the necessary data are latched by the latch circuits, so that it is possible to eliminate wasteful data write to the latch circuits, thus realizing a high speed data transfer.

DETAILED DESCRIPTION OF THE EMBODIMENTS

The embodiment of the memory device according to the present invention will be described hereinbelow with reference to the attached drawings.

Figure 1:
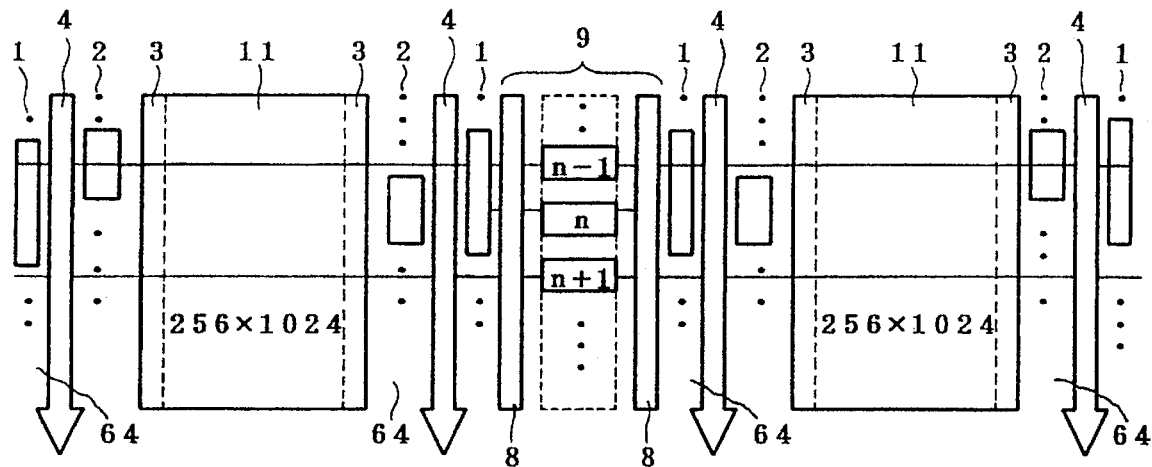
FIG. 1 is a schematic block diagram showing an embodiment of the memory device according to the present invention.

FIG. 1 is a schematic block diagram showing an embodiment of the memory device according to the present invention, in which the circuit configuration related to only the row direction access is shown. In FIG. 1, two 256-Kbit cell blocks 11 are shown as a part of a memory cell array. Further, each cell block 11 is composed of 256 row x 1024 columns.

On both sides of each cell block 11, 512-column sense amplifiers 3 are arranged. Further, on both sides of each cell block 11, latches (SRAM cells) 2 directly accessible from the outside (whose number is equal to the sense amplifiers 3) are arranged. These latches 2 are so constructed as to be accessible for each 8 bits simultaneously, that is, in unit of byte.

As the byte data transfer path, byte data lines 4 are arranged in the vicinity of the latches 2, respectively. Further, a byte write mask circuit block 1 is provided for each latch 2, to enable data transfer between the latches 2 and the corresponding sense amplifiers 3, only when byte data are written from a byte data line 4 to the latches 2. Between the two cell blocks 11 of 256 Kbits, column decoders 9 are provided for selecting the latches 2 in unit of byte. The column decoders 9 are used in common for both side cell blocks 11 so as to activate only one of the cell blocks 11 in divisional operation.

The latches 2 are arranged on both sides of each cell block 11. Further, on both sides of the latches 2, a byte pair read decoders 8 is arranged, respectively. The byte pair decoder 8 decides whether the both-side latches 2 are selected as a pair or only the one-side latches 2 are selected as a single. When the one-side latches 2 are selected, the numbers of the column decoders 9 corresponding to the latches 2 are n−1, n, n+1, . . . . On the basis of the numbers of the column decoders 9, the selection conditions are determined. For instance, in the case of n−1, the latches 2 arranged on the side opposite to the column decoders 9 are selected; in the case of n, the latches 2 arranged on the same side of the column decoders. 9 are selected; and so on.

Figure 2:
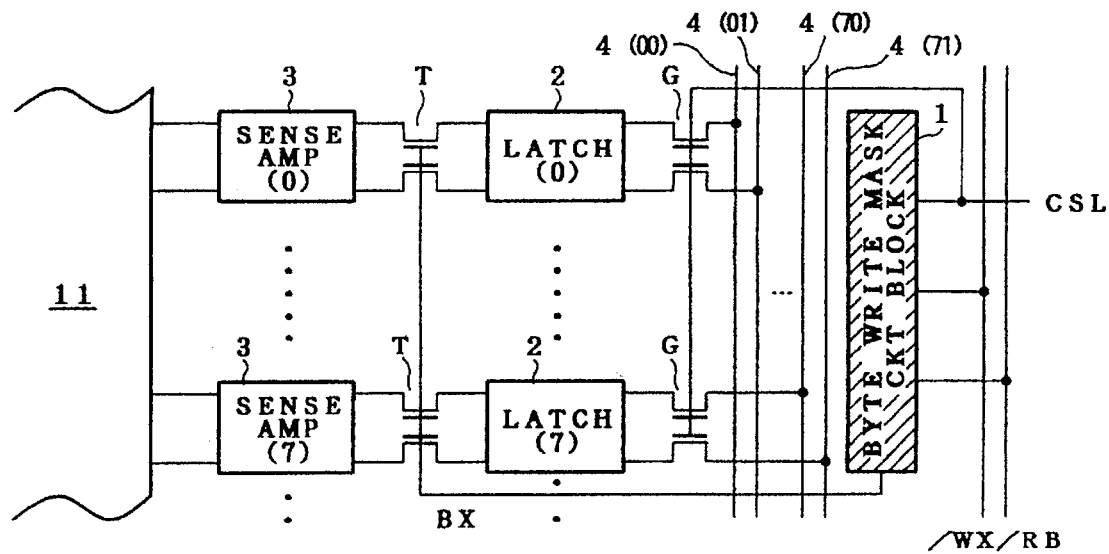
FIG. 2 is a detailed circuit diagram showing the essential portion related to data transfer operation in FIG. 1.

FIG. 2 shows a practical circuit related to the essential portion of the data transfer in FIG. 1, in which there are shown the sense amplifiers 3, the latches 2, the byte data lines 4, the byte write masks circuit block 1, and control signals all arranged on one side (the right side in FIG. 1) of the cell block 11.

The 8 sense amplifiers 3(0) to 3(7) provided on one side of the cell block 11 are connected to the 8 latches 2(0) to 2(7) via 8 switching transistors T, respectively. On the other hand, a byte transfer signal BX applied to the gates of the switching transistors T is formed by the byte write mask circuit block 1. When this byte transfer signal BX changes to an H level in transfer, data can be written selectively for each byte in the latches 2.

The 8 latches 2 for constituting one byte are connected to the 8-pair byte data lines 4(00), 4(01) to 4(70), 4(71) via gates G, respectively. Further, data are transferred simultaneously to the latches 2 corresponding to the byte to which the select signals CSL of the selected column decoders 9 change to the H level.

When the select signal CSL changes to the H level, the byte write mask circuit block 1 stores this H level. After that, when a word transfer signal/WX changes to the L level, the byte transfer signal BX is set to the H level, so that the data already written in the latches 2 are transferred to the sense amplifiers 3, respectively.

A signal read byte/RB is used to read data from any bytes in data read, irrespective of The select signal CSL. In other words, when the signal read byte/RB is set to the L level, the byte transfer signal BX is set to the H level, to transfer data of the sense amplifiers 3 to all the latches 2, respectively.

Figure 1A:
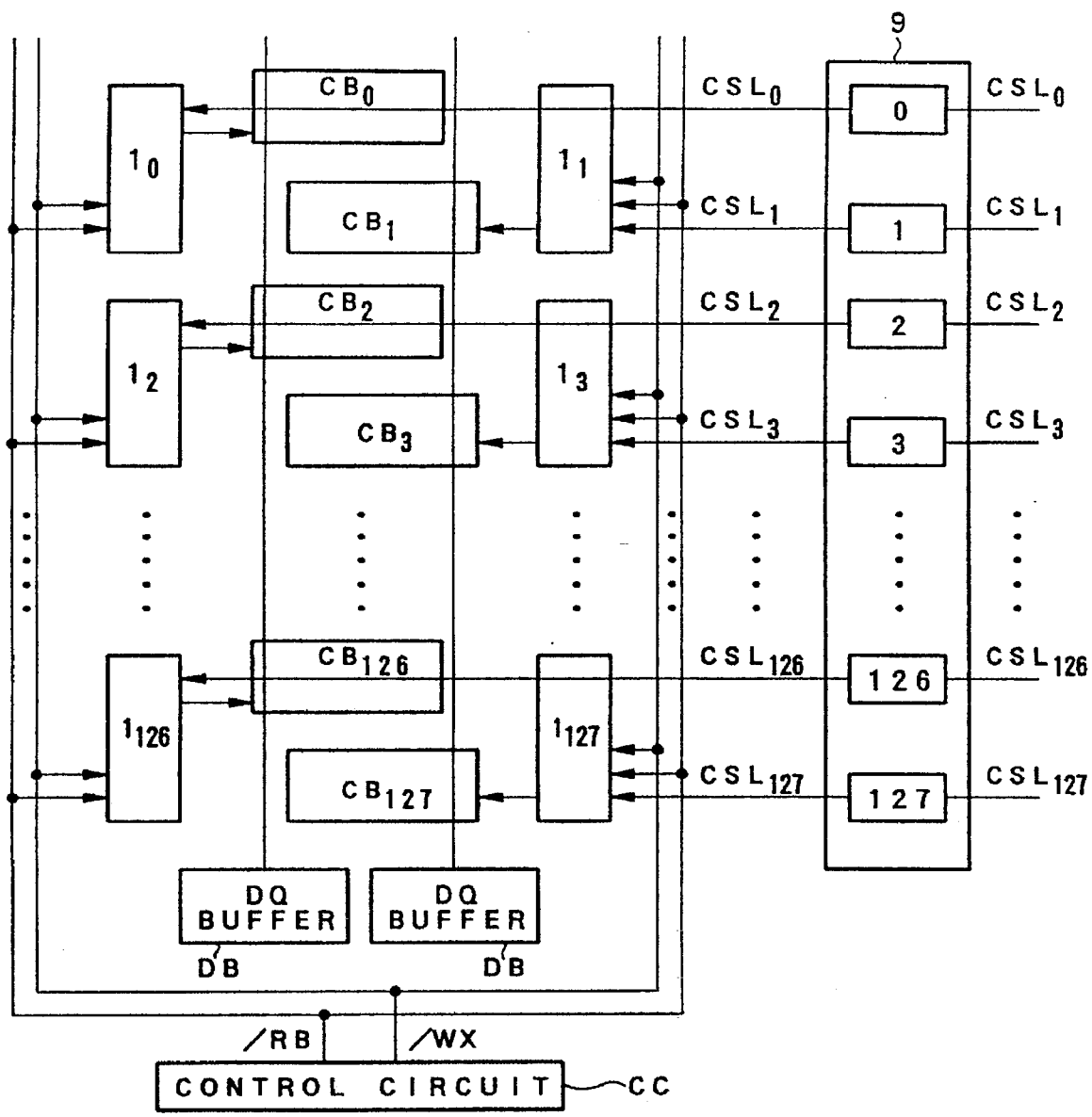
FIG. 1A is a part of more practical circuit shown in FIG. 1.
Figure 2A:
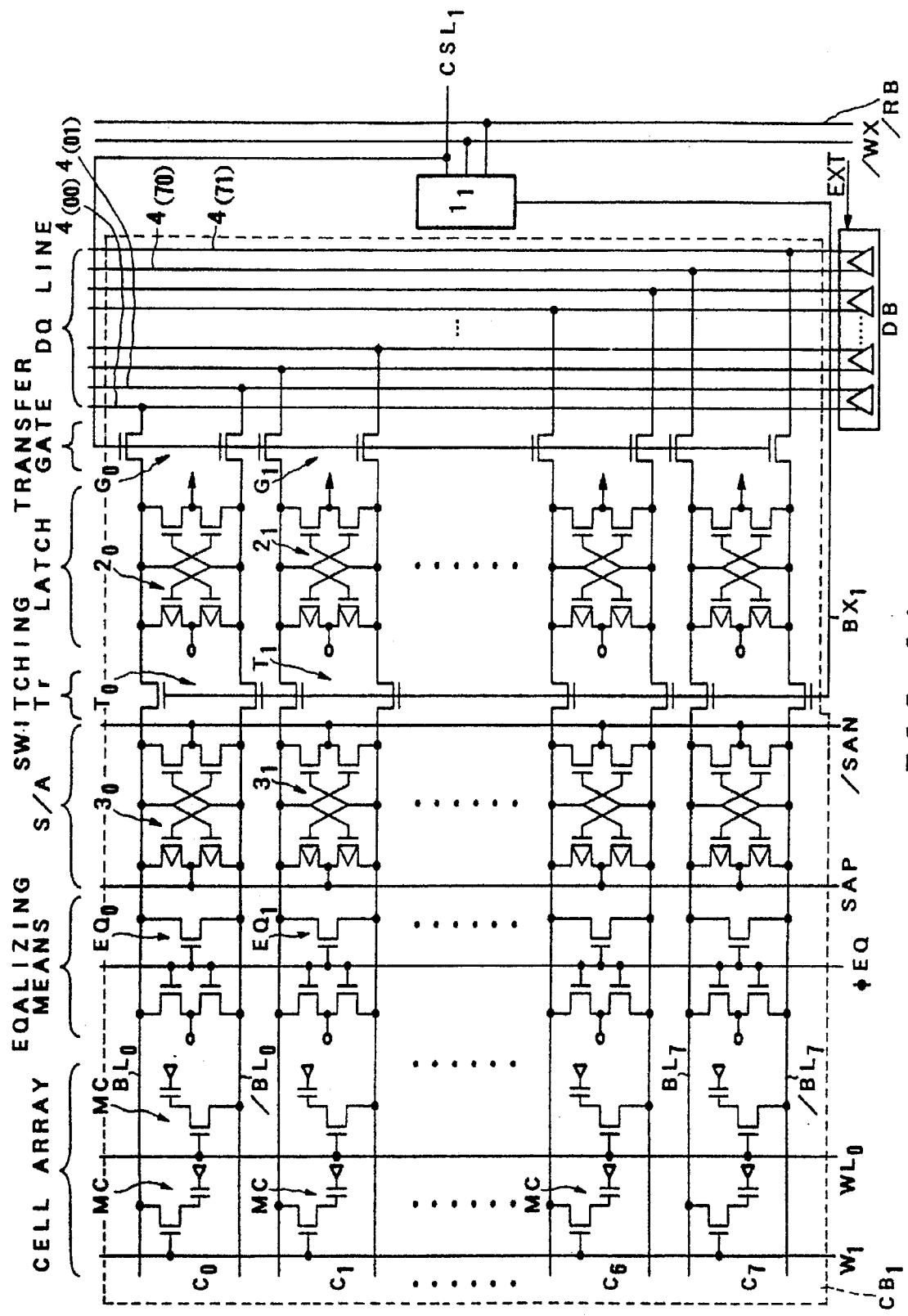
FIG. 2A is a detailed block diagram showing the even ordinal number column blocks.
Figure 2B:
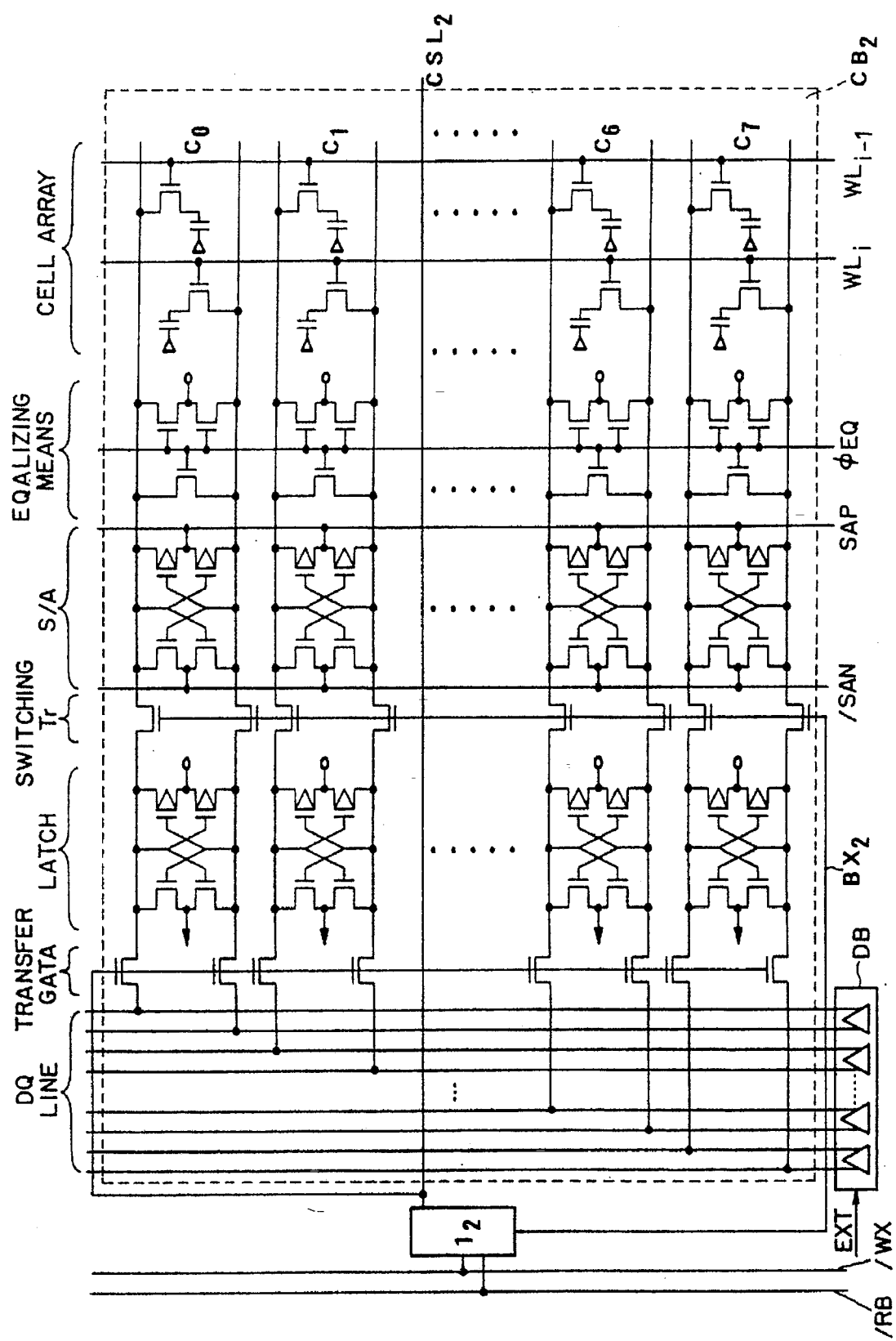
FIG. 2B is a detailed block diagram showing the odd ordinal number column blocks.

More practical. circuits shown in FIGS. 1 and 2 are shown in FIGS. 1A, 2A and 2B, respectively.

FIG. 1A shows a part of the circuit shown in FIG. 1. In FIG. 1A, the same reference numerals have been retained for the similar elements which have the same functions as with the case shown in FIG. 1. The cell block 11 is composed of 128-units of column blocks $CB_0$ to $CB_{127}$, and each column block is composed of 8 columns. The two adjacent column blocks $CB_i$ and $CB_{i+1}$ are arranged in symmetry in FIG. 1A. In more detail, the odd ordinal number column blocks $CB_0$, $CB_2$, . . . are arranged as shown in FIG. 2B, and the even ordinal number column blocks $CB_1$, $CB_3$, . . . are arranged as shown in FIG. 2A. To the respective column blocks $CB_i$ and $CB_{i+1}$, the byte write mask block circuits $1_i$ and $1_{i+1}$ arranged on both sides of the column blocks are connected, respectively. The reason why the byte write mask block circuit 1 is arranged on both sides as shown in FIG. 1A is that since the size of this circuit 1 is relatively large, it is difficult to arrange this circuit only one side of the column block. By the layout as described above, it is possible to reduce the pattern area of the device. To each byte write mask block circuit $1_i$, a select signal $CSL_i$ is applied from the column decoder 9 together with the signals/RB and/WX applied from the control circuit CC.

FIG. 2A shows the essential portion of the column block $CB_1$ shown in FIG. 1A, in which the column block $CB_1$ is composed of 8 columns $C_0$ to $C_7$.

The read operation can be executed as follows: For instance, when a word line $WL_0$ is activated, data of the memory cell MC is read to the bit lines $BL_0$ and $/BL_0$ previously equalized by the equalizing means $EQ_0$. The read data is sensed and further amplified by the sense amplifier (S/A) $3_0$. The data sensed by the sense amplifier (S/A) $3_0$ is stored by a latch $2_0$ via two switching transistors $T_0$. The data of the latch $2_0$ is transmitted to the DQ data lines $4_{(00)}$ and $4_{(01)}$ via two transfer gates $G_0$. The above-mentioned switching transistors $T_0$ are turned on or off on the basis of the signal $BX_i$ applied by the byte write mask circuit $1_1$. The above-mentioned transfer gates $G_0$ are turned on or off on the basis of the select signal $CSL_1$ applied by the column decoder 9.

The write operation is executed as follows: The case where only data of the two column blocks $CB_1$ and $CB_2$ are rewritten will be described hereinbelow. Two 8-bit data $DG_1$ and $DG_2$ applied from the external EXT are previously written in the respective latches $2_0$ to $2_7$, and $2_0$ to $2_7$ of the column blocks $CB_1$ and $CB_2$ via the DQ buffers DB being divided into two times (data loads 1 and 2). After that, the latched data are transferred to and stored at the respective 8-bit memory cells connected to the activated word lines of the column blocks $CB_1$ and $CB_2$. In this transfer, the switching transistors T connected to the non-rewrite column blocks $CB_0$, and $CB_3$ to $CB_{127}$ (to which no data are written) are kept turned off (i.e., masked). Therefore, it is possible to prevent data in the non-rewrite column blocks from being destroyed.

Figure 2C:
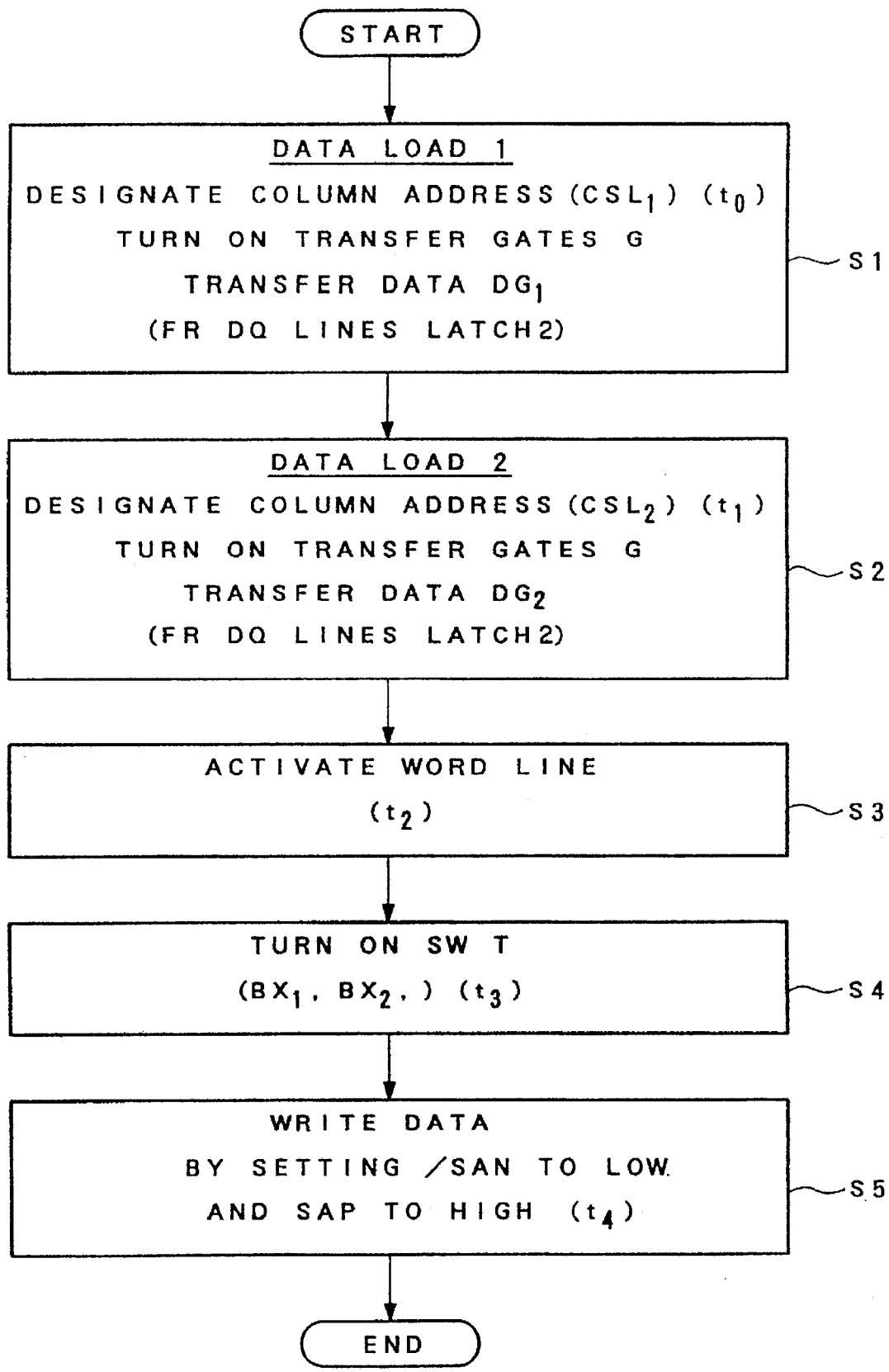
FIG. 2C is a flowchart showing a data rewrite procedure according to the present invention.
Figure 2D:
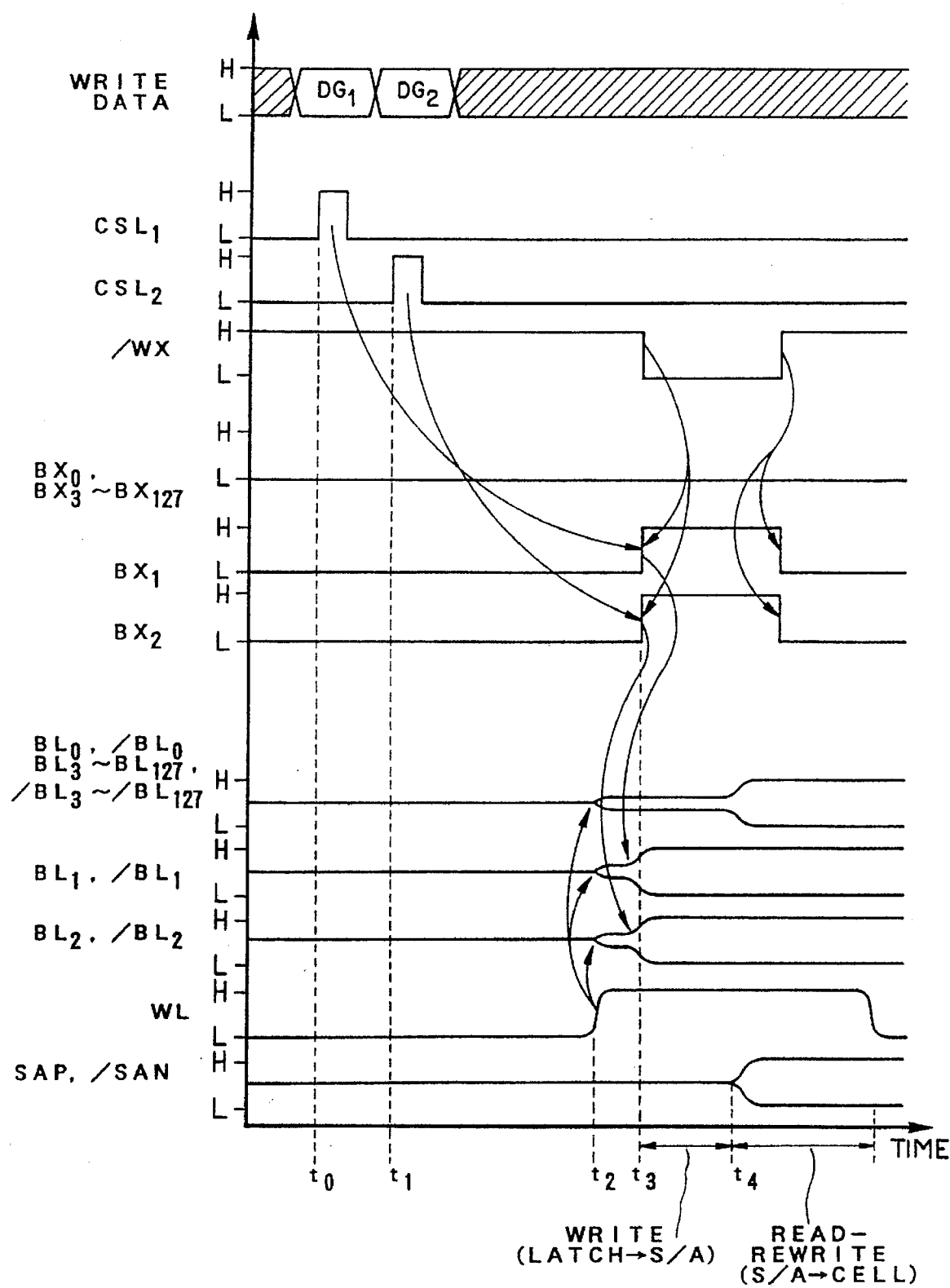
FIG. 2D is a timing chart showing the operation of the data rewrite procedure shown in FIG. 2C.

The above-mentioned data write operation will be described in further detail with reference to a flowchart shown in FIG. 2C and a timing chart shown in FIG. 2D.

(i) Data load 1 is executed (in step S1). That is, the column select signal $CSL_1$ is outputted to designate a column address in the column block $CB_1$ (at time $t_0$) Further, the transfer gates G are turned on, so that data (DG1) is transferred from the DQ lines to the latch 2 and then stored thereat (at time $t_0$).

(ii) Data load 2 is executed (in step S2). That is, the column select signal $CSL_2$ is outputted to designate a column address in the column block $CB_2$ (at time $t_1$). Further, the transfer gates G are turned on, so that data (DG2) is transferred from the DQ lines to the latch 2 and then stored thereat (at time $t_1$).

(iii) The word line WL is activated (in step S3, at time t2).

(iv) Only in the column blocks $CB_1$ and $CB_2$, the switching transistors T are turned on on the basis of the signals $BX_1$ and $BX_2$, so that data are transferred from the latch to the sense amplifiers 3 (in step S4 and at time $t_3$). In other column blocks $CB_0$, $CB_3$, . . . $CB_{127}$, the data transfer as described above is not executed.

(v) In the above-mentioned masked conditions, the signal/SAN is set to a low level and the signal SAP is set to a high level (in step S5 and at a time $t_4$). By this, data can be rewritten in only the column blocks $CB_1$ and $CB_2$. In the other column blocks, the data read from their own column blocks are written again as they are, so that it is possible to prevent data from being destroyed at the other column blocks.

The above-mentioned control operation can be executed under control of the control circuit CC.

Figure 3:
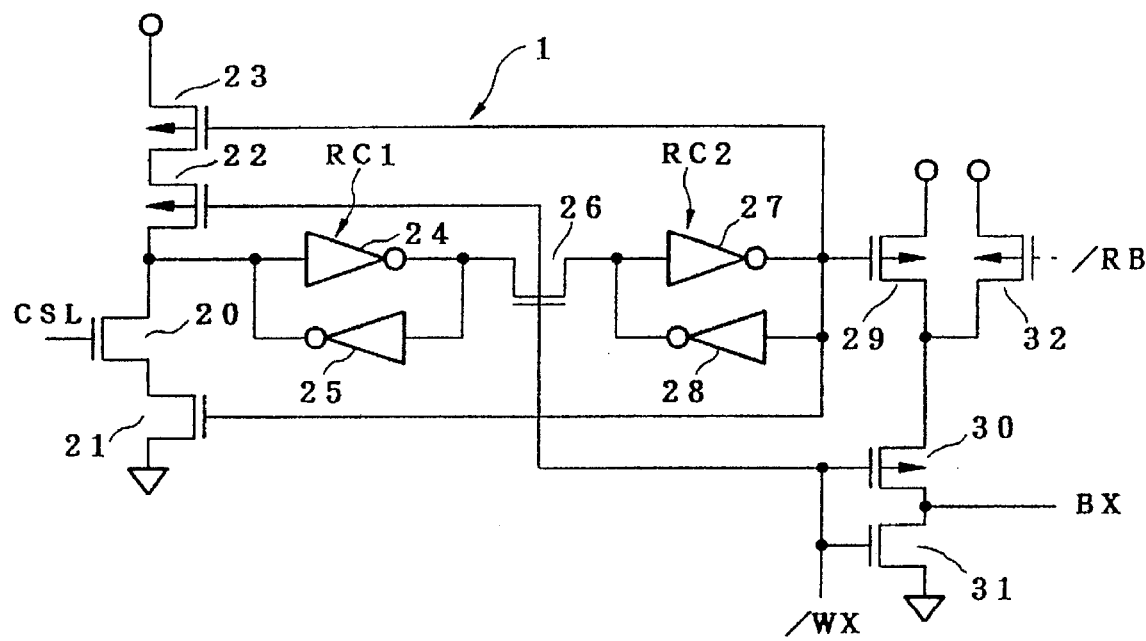
FIG. 3 is a practical circuit diagram showing the byte write mask circuit block 1 shown in FIGS. 1 and 2.

FIG. 3 shows a practical byte write mask circuit block 1 shown in FIGS. 1 and 2. As shown in FIG. 3, the select signal CSL is inputted to the gate of an N-channel MOS transistor 20. Further, the word transfer signal/WX is given to the gates of a P-channel MOS transistor.22, an N-channel MOS transistor 26, a P-channel MOS transistor 30, and N-channel MOS transistor 31. On the other hand, the signal read byte/RB is inputted to the gate of a P-channel MOS transistor 32. Further, the source of the transistor 20 is connected to a low potential supply voltage via an N-channel MOS transistor 21. The drain of the transistor 20 is connected to a high potential supply voltage via P-channel MOS transistors 22 and 23. The drain of the transistor 20 is connected to the source of the transistor 26 via two opposite parallel connected inverter circuits 24 end 25. The drain of the transistor 26 is connected to the gates of the transistor 21 and P-channel MOS transistors 23 and 29 via two opposite parallel connected inverter circuits 27 and 28. The source of the transistor 29 is connected to the high potential supply voltage, and the drain thereof is connected to the source of the transistor 30 and the drain of the transistor 32. Further, the source of the transistor 32 is connected to the high potential supply voltage, and the source of the transistor 31 is connected to the low potential supply voltage. Further, the byte transfer signal BX is outputted from the drains of the transistors 30 and 31. In the above-description, the two inverter circuits 24 and 25 are provided with an input-data self-holding function, which is referred to as a first register circuit RC1, hereinafter. In the same way, the two inverter circuits 27 and 28 are provided with the similar self-holding function, which is referred to as a second register circuit RC2, hereinafter.

In the circuit construction as described above, the level of the select signal CSL is held by the first register circuit RC1. The second register circuit RC2 connected in series with the first register circuit RC1 is provided to generate the byte transfer signal BX for byte latch transfer, where necessary, in response to the select signal CSL held by the transistor 26.

The first register circuit RC1 stores the H level of the select signal CS in the following two cases:

(1) The case where data are not being transferred and further where the word transfer signal/WX for transferring data to the sense amplifiers 3 is at the H level so that the transistor 26 is turned on and the transistor 22 is turned off to select the byte write mask circuit block 1 for the first time. In other words, the case where the transistor 21 is turned on and further the transistor 23 is turned off.

(2) The case where data are being transferred and further where the word transfer signal/WX is at the L level so that the transistor 26 is turned off and the transistor 22 is turned on and further where the second register circuit output is at the H level so that the transistor 23 is turned off and the transistor 21 is turned on. That is, the case of the latch to which data are not being transferred.

When data are being transferred and further the output of the second register circuit RC2 is at the L level, that is, when corresponding to the latch to which data are being now transferred, since the transistors 23 and 22 are both turned on and the transistor 21 is turned off, the status of the first register circuit RC1 is reset irrespective of the level of the select signal CSL.

Through the above-mentioned operation, data transfer is made on the basis of only the select signal CSL selected before the transfer start time point, and these latches 2 are reset to the non-select status after the data transfer. Further, the latches 2 selected during the transfer can transfer data at the succeeding data transfer, so that it is possible to guarantee the continuity of the data write in the latches 2. Further, in the memory initialization operation of resetting the first register circuit RC1, the word transfer signal/WX is changed from the H level to the L level and then returned to the H level. On the other hand, the second register circuit RC2 receives the output of the first register circuit RC1 and holds the received output as the information for outputting the byte transfer signal BX, during the period other than the data transfer. Further, the first and second register circuits RC1 and RC2 are disconnected from each other during the data transfer period by the transistor 26 on the basis of the word transfer signal/WX applied to the gate thereof.

Further, the signal read byte/RB inputted to the gate signal BX (as the data transfer control signal) to the H level during the data transfer period, irrespective of the status of the second register circuit RC2.

In other words, the byte write mask circuit block 1 comprises the first register circuit RC1 for storing the selection of a group of the latches 2, and the second register circuit RC2 for holding the status of the first register RC1 (connected to the second register RC2 via the transistor (switching element) 26) as the information for forming the byte transfer signal BX. Therefore, when data are transferred to the sense amplifiers 3, the first register circuit RC1 is disconnected from the second register circuit RC2 by this switching transistor 26, so that the first register circuit RC1 can hold the status selected during this disconnection period. Further, the second register circuit RC2 can hold the status of the first register circuit RC1 immediately before data are transferred, to form the byte transfer signal BX.

Through the operation as described above, it is possible to eliminate the wasteful time related to the high speed data access, thus enabling a high-efficiency operation beyond the dynamic memory device.

Figure 4:
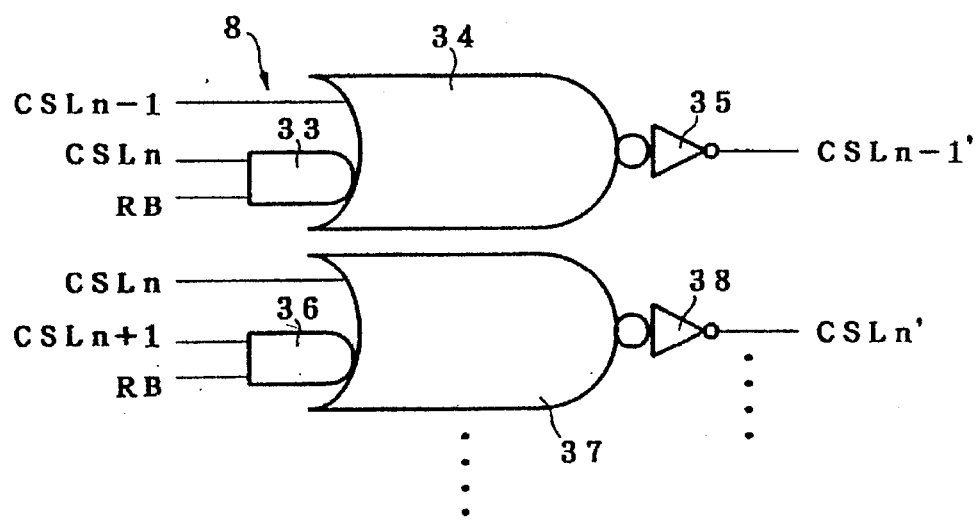
FIG. 4 is a practical circuit diagram Showing the byte pair read decoder 8 shown in FIG. 1.

FIG. 4 is a detailed block diagram showing the byte pair read decoder 8 for changing the selection mode of the latches 2 by the column decoders 9. As shown in FIG. 4, a select signal CSLn and a signal read byte RB are inputted to an NOR circuit 34 through an AND circuit 33. A select signal CSLn-1 is directly inputted to the NOR circuit 34. The output of the NOR circuit 34 is outputted as a select signals CSL via an inverter circuit 35. In the same way, a select signal CSLn+1 and a signal read byte RB are inputted to an NOR circuit 37 through an AND circuit 36. A select signal CSLn is directly inputted to the NOR circuit 37. The output of the NOR circuit 37 is outputted as another select signal CSL via an inverter circuit 38.

In other words, when byte data are read from the cell block 11, it is possible to read two continuous byte data from one cell block 11 by utilization of the byte data lines 4 arranged on both sides of the cell block 11. Further, when data written, it is of course possible to write two byte continuous data simultaneously in the same way.

As described above, the byte pair read decoder 8 is used to change-over the two-byte data read/write to the ordinary one-byte data read/write or vice versa.

Here, the one-byte mode and the two-byte mode can be switched on the basis of the signal RB (the inversion signal of the signal read byte/RB).

When the signal read byte/RB is at the L level, the select signal CSL is set to the H level even when the succeeding column decoders 9 are selected. When the column decoders 9 are selected, two continuous select signals CSL are both at the H level, so that two latches 2 can be selected.

On the other hand, when the signal read byte/RB is at the H level, only the select Signals CSL corresponding to the respective column decoders 9 are at the H level.

As described above, in the memory device according to the present invention, in the dynamic memory, when data are stored temporarily by the latches 2 and then transferred to and from the cell block 11, the transfer gates interposed between the cell block 11 and the sense amplifiers 3 are controlled independently for each group of at least two latches 2. Further, the byte write mask circuit blocks 1 for the above-mentioned control are arranged for each group of the latches 2. When the data are transferred to the sense amplifiers 3, the data transfer can be executed only in the group of the latches 2 in which data are written, but the data transfer cannot be executed in the group of the latches 2 in which data are not written by keeping the transfer gates closed. By doing this, it is possible to improve the access speed of the dynamic memory markedly.

Further, in the memory device according to the present invention, since the byte data are inputted in series and further these byte data are transferred to the DRAM in parallel at a time, it is possible to regard the latches 2 and the byte write mask circuit blocks 11, etc. as a serial-parallel data transforming circuit so constructed that the data outputs can be controlled for each data block.

In other words, in the serial-parallel data transforming circuit such that data are inputted in series to the latches 2 corresponding to each data group in series and further these data of the latches 2 are outputted simultaneously for data transfer, the construction is such that the transfer gates are provided to output parallel data in such a way that the transfer gates can be controlled independently for each group of a plurality of latches 2 and further the byte write mask circuit block 1 for this control is provided for each group of the latches 2. Therefore, when the parallel data are outputted, the data transfer is controlled in such a way that data are transferred to and from only the group of the latches 2 to which data have been written, and data are not transferred to and from only the group of the latches 2 to which data have not been written. The above-mentioned function can be regarded as that only the latches 2 to which data are inputted in series can function the serial-parallel data transforming circuit.

In the construction as described above, since the data transfer efficiency can be improved markedly in the serial-parallel data transforming circuit, when this construction is applied to the dynamic memory device, it is possible to increase the data transfer speed markedly.

As described above, in the DRAM of the type such that the SRAM is interposed to transfer data at high speed to and from the memory cells continuously during the data transfer period, in the memory device according to the present invention, since only any determined data can be transferred to and from the memory cells, it is possible to realize a high speed access in the DRAM.

In the memory device according to the present invention, since data are outputted from only the latch circuits (to which data have been written) and then transferred to the sense amplifier circuits, it is possible to eliminate the data write of the latch circuits corresponding to the bits (to which no data write are necessary), thus realizing the high speed access. Further, in the serial-parallel data transforming circuit according to the present invention, since data of only the latch circuits (to which serial data are written) are parallel transformed and then outputted, the transforming efficiency can be increased.

What is claimed is:

1. A serial-parallel data transforming circuit comprising:

serial data inputting means for receiving external serial data;

latching means having a plurality of latches for latching each of the serial data, said latches being divided into a plurality of latch groups, each latch group being formed by a predetermined number of said latches;

a plurality of data transfer gates, each data transfer gate being provided at an output terminal of a corresponding one of said latches; and transfer masking means for controlling said data transfer gates, wherein each of the serial data is written in the latches of a selected latch group, and said transfer masking means operates to turn on said data transfer gates corresponding to latch groups in which data have been written in order to output parallel data therefrom while keeping turned off said data transfer gates corresponding to latch groups in which data have not been written.

2. The serial-parallel data transforming circuit as defined in claim 1, wherein serial data is written in a portion of the plurality of latch groups, and the portion of the plurality of latch groups that are written into functions as a serial-parallel data transforming circuit.

3. The serial-parallel data transforming circuit as defined in claim 1, wherein said transfer masking means comprises:

a first register circuit for storing the selection of the corresponding latch group at a selected time point, when the corresponding latch group is selected; and a second register circuit connected in series with said first register circuit via a switching element, for storing the information stored in said first register as information for generating a signal for controlling the transfer gates corresponding to the latches of the corresponding latch group, wherein when data is written to the latches of the corresponding latch group, the switching element is turned off to disconnect said first register circuit from said second register circuit, the selection of the corresponding latch group under this disconnected status being stored in said first register circuit, and data stored in said first register circuit immediately before the data is written is output to said second register circuit as the information for generating the signal for controlling the transfer gates.

* * * * *